United States Patent

Mitani et al.

[15] 3,697,826

[45] Oct. 10, 1972

[54] JOSEPHSON JUNCTION HAVING AN INTERMEDIATE LAYER OF A HARD SUPERCONDUCTING MATERIAL

[72] Inventors: Masao Mitani; Katzuzo Aihara; Mitsuhiro Kudo; Nobuhiro Hara, all of Tokyo-to; Fujio Irie; Kaoru Yamafuji, both of Fukuoka, all of Japan

[73] Assignee: Hitachi, Ltd., Tokyo, Japan

[22] Filed: Dec. 29, 1970

[21] Appl. No.: 102,370

[30] Foreign Application Priority Data

Dec. 29, 1969 Japan ....................44/105294

[52] U.S. Cl. .........317/234 R, 317/234 S, 317/234 T, 331/107 S, 332/52, 307/306

[51] Int. Cl. ................................................H01l 9/00

[58] Field of Search.....317/234 S, 234 T; 331/107 S; 332/52; 307/306

[56] References Cited

UNITED STATES PATENTS

| | | | |
|---|---|---|---|
| 3,573,661 | 4/1971 | McCumber | 331/107 |
| 3,564,351 | 2/1971 | McCumber | 317/234 |
| 3,528,005 | 9/1970 | Morse et al. | 324/43 |
| 3,458,735 | 7/1969 | Fishe | 307/306 |
| 3,423,607 | 1/1969 | Kunzler | 307/306 |
| 3,281,609 | 10/1966 | Rowell | 307/88.5 |
| 3,370,210 | 2/1968 | Fishe | 317/235 |

*Primary Examiner*—Martin H. Edlow
*Attorney*—Craig, Antonelli & Hill

[57] ABSTRACT

Superconducting element using the Josephson effect formed by first and second layers of a soft superconducting material having a third layer of a hard superconducting material interposed therebetween, the third layer having a lower critical magnetic field which is smaller than the critical magnetic fields of said first and second layers.

8 Claims, 7 Drawing Figures

INVENTORS

MASAO MITANI, KATZUZO AIHARA,
MITSUHIRO KUDO, NOBUHIRO HARA,
FUJIO IRIE AND KAORU YAMAFUJI

BY Craig, Antonelli,
Stewart & Hill
ATTORNEYS

INVENTORS
MASAO MITANI,
KATZUZO AIHARA,
MITSUHIRO KUDO,
NOBUHIRO HARA,
FUJIO IRIE AND
KAORU YAMAFUJI

BY Craig, Antonelli, Stewart & Hill
ATTORNEYS

JOSEPHSON JUNCTION HAVING AN INTERMEDIATE LAYER OF A HARD SUPERCONDUCTING MATERIAL

This invention relates to a superconducting element using the Josephson effect, and more specifically, to a superconducting element having in its current-voltage characteristic a d.c. effect region in which the critical value of the superconducting current flowing in the element is changed according to the magnitude of the applied magnetic field, and an a.c. effect region in which an a.c. current whose frequency is changed according to the voltage applied to the element is produced.

It is known that when a d.c. voltage is applied to a superconducting element in which a thin insulating layer of about 10 to 20 A thickness is disposed between two thin superconducting layers, a several hundred megahertz frequency oscillation occurs. The power of this oscillation, however, is only about $10^{-10}$ watt. This is why no practical electronic device successfully utilizing this conventional superconducting element has so far been proposed.

In view of the foregoing, a principal object of this invention is to provide a superconducting element capable of generating a high power a.c. oscillation.

Another object of this invention is to provide a structurally simple and easily manufacturable superconducting element.

For the purpose of achieving the foregoing objects, the invention provides a superconducting element in which a layer of a hard superconducting material with a thickness of several tens to several thousands of angstroms is formed between two pieces or layers of soft superconducting material.

The other objects, features and advantages of the invention will be apparent from the following detailed description when read in conjunction with the accompanying drawings in which.

Figure 3:
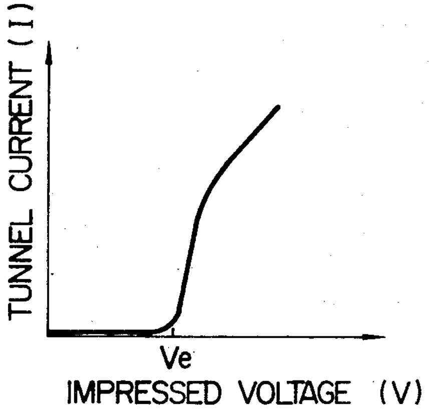
FIGS. 3 and 4 are diagrams showing current-voltage characteristics of a conventional superconducting element.

Referring first to FIG. 3, there is shown a generally known current-voltage characteristic of a superconducting element in which an insulating layer with a thickness of several tens of angstroms is disposed between two pieces of superconductor. As seen from this characteristic, almost no current flows in the element when the voltage *V* applied to the element is smaller than the voltage *Ve* which corresponds to the energy gap of the superconductor. However, if the voltage *V* is larger than *Ve*, than a current flows due to the usual tunnel effect.

Figure 1:
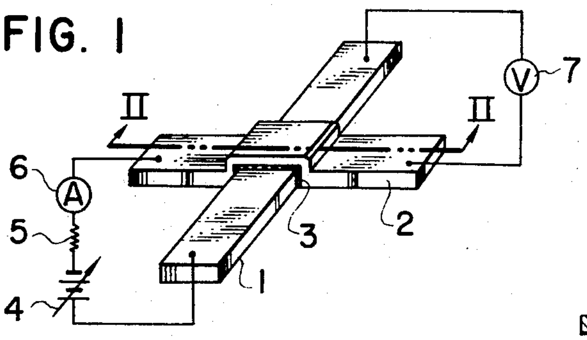
FIG. 1 is a perspective view showing a conventional superconducting element.
Figure 2:
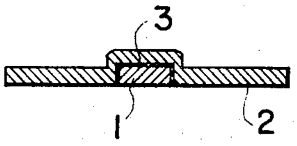
FIG. 2 is a sectional view taken along line A—A' in FIG. 1.

When the insulating layer is as thin as 10 to 20 A, the superconducting element exhibits a peculiar property called the Josephson effect. FIGS. 1 and 2 are diagrams showing an example of a Josephson effect element. The references 1 and 2 denote two superconducting layers of niobium, lead or the like, 3 designates an insulating layer with a thickness of 10 to 20 A, consisting of a niobium oxide, lead oxide, macro-molecular layer, etc.

Figure 4:
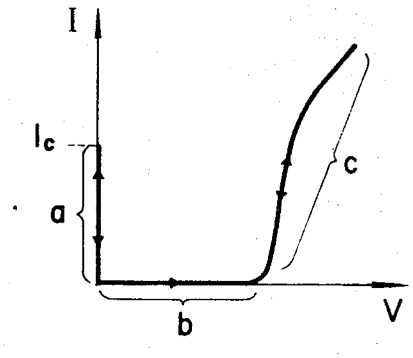

To observe the current-voltage characteristics of this superconducting element, a variable d.c. power source 4, a resistor 5 and a milliammeter 6 are connected serially across respective ends of the super conducting layers 1 and 2, a voltmeter 7 is connected across the other ends of the superconducting layers 1 and 2, and the superconducting element is kept at a very low temperature of 4.2°K; thus, the superconducting layers 1 and 2 are maintained in the superconducting state. By this arrangement, the current flowing through the element is observed for various values of voltage *V* applied to the element itself. FIG. 4 shows the resultant current-voltage characteristic of the element.

According to this characteristic, the region *a* in FIG. 4 shows the state where current is flowing through the element even when the voltage across the terminals of the element is 0. Thus, the region *a* indicates the state where superconducting current is flowing through the element. Hereinafter, the region *a* will be referred to as d.c. effect region. The critical current value *Ic* in the region *a* changes very sensitively in response to the change in the magnitude of the magnetic field applied to the element. Generally this phenomenon is called the d.c. effect.

The region *b* shows the condition where almost no d.c. current is flowing in the element itself even when voltage is present across the terminals of the element. In the region *b*, it is to be noted that a high frequency oscillation at about 500MHz occurs in the insulating layer 3. In other words, in the region *b*, a high frequency oscillation takes place in the element itself, and a microwave power can be derived from the element. It is recognized that the oscillation frequency is proportional to the voltage applied to the element itself. Such an oscillation phenomenon is called the a.c. effect. Hereinafter, the region is referred to as the a.c. effect region.

The d.c. and a.c. effects were predicted by B. D. Josephson in 1962 (reference to Phys. Letters 1, 251, 1962), and experimentally proved by P. W. Anderson and J. M. Rowell (reference to Phys. Rev. Letters 10, 230, 1963). The Josephson effect will be described below from the qualitative point of view in connection with the principles of this invention.

The fundamental of the Josephson effect lies in the fact that the superconducting electron can tunnel through the insulating layer. This implies that equivalently the insulating layer is in the superconducting state. The value of *Ic* in the d.c. effect region is indicative of the value of the critical current in the insulating layer which is in the superconducting state. When a current more than the critical value *Ic* flows through the element, the insulating layer shows a resistive state wherein the quantum magnetic flux enters into the insulating layer and flows therein. This means that the insulating layer which equivalently is in the superconducting state corresponds to a hard superconductor, and that the value of the lower critical magnetic field $HC_1$ is related to the value *Ic*.

When the quantum magnetic flux passes through the insulating layer, an eddy current accordingly flows through the insulating layer. The direction of the flow of the eddy current is symmetrical with respect to the magnetic flux. Hence, when the quantum magnetic flux moves along the insulating layer, the current flowing in the insulating layer oscillates, and this oscillation causes a microwave to be emitted therefrom. The oscillation frequency is proportional to the moving velocity of the quantum magnetic flux; while, the flow of the quantum flux indicates that a constant voltage is produced in the insulating layer. The amplitude of the voltage is proportional to the velocity of the quantum magnetic flux flow. This relationship is expressed by the following simple equation:

$$h\nu = 2eV \quad (1)$$

where $h$ : Planck's constant $\nu$ : oscillation frequency $e$ : electron charge $V$ : voltage applied to the insulating layer Thus, the oscillation frequency is calculated as $\nu = 483.6 \times V\ (MHz/\mu V)$.

Namely, in the a.c. effect region, the superconducting element using the Josephson effect generates a microwave oscillation whose frequency is proportional to a wide range of voltage applied to the element. This peculiar oscillation output, however, could not have been successfully utilized for electric or electronic devices in the prior art, because the superconducting element can generate only a very small output power of about $10^{-10}$ watt, which is incomparable to that of the usual microwave oscillator or modulator.

In view of the foregoing, the present invention has for its principal object the provision of an improved superconducting element using the Josephson effect which is capable of increasing the microwave oscillation output in its a.c. effect region.

To increase the oscillation output, two basic approaches can be considered; first, the conversion efficiency can be increased by improving the impedance matching between the element and the cavity resonator when a microwave output is derived from the Josephson element and, second, the power supplied to the element can be increased. The present invention relates to the second approach.

The oscillation output $P$ is proportional to the power Pin supplied to the element. Namely, $$P \propto \mathrm{Pin} \propto i \cdot v \quad (2)$$

where $i$ : amplitude of the a.c. Josephson current $v$ : width of voltage oscillation region (width of negative resistance region)

Assuming that the density of the d.c. Josephson current is $J_1$, and the equivalent intrusion depth of the insulating layer is $\lambda_J$, then $$i \propto Ic = J_1 \lambda_J \propto J_1 \propto Hc_1 \quad (3)$$

or $$V \propto J_1 \propto Hc_1^2 \quad (4)$$

Therefore $$P \propto Hc_1^3 \quad (5)$$

From the above relationship, it is seen that it is necessary to increase the lower critical magnetic field in the layer located between the superconducting layers when the oscillation output is to be increased.

Based on the foregoing theoretical considerations, the invention provides a novel Josephson element capable of delivering a greater oscillation output in comparison with the conventional Josephson element. The fundamental arrangement of the Josephson element of this invention will be described below by referring to FIG. 5.

Figure 5:
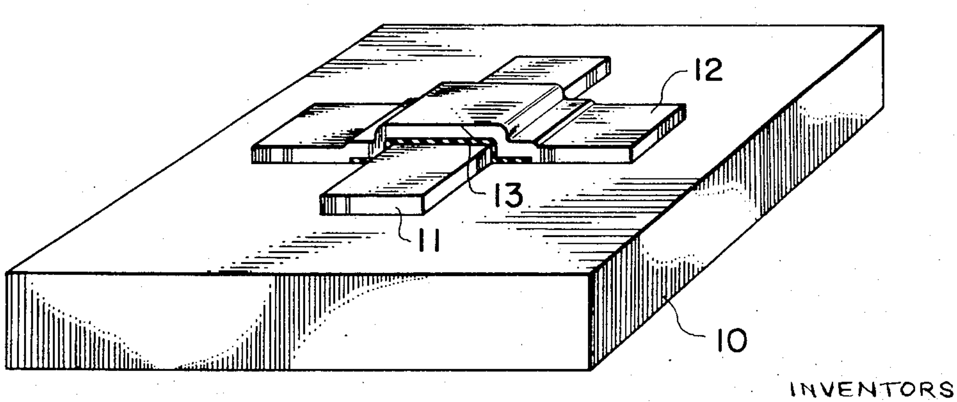
FIG. 5 is a perspective view showing a superconducting element embodying this invention.

In FIG. 5, the reference 10 denotes a glass or quartz substrate, and 11 and 12 designate superconducting thin films formed on the substrate 10 to a thickness of more than 1 to 2 $\mu$ and a width of usually about 0.1 mm. Lead, niobium, tantalum or the like is used for the material of these superconducting films. The reference 13 denotes an intermediate layer with a thickness of several tens to several thousands of angstroms, which is interposed between the two superconducting films. This intermediate layer is made of a hard superconducting material whose lower critical magnetic field $Hc_1$ is smaller than the critical magnetic field $Hc$ of the superconducting material which constitutes the superconducting films 11 and 12. This is one of the noteworthy features of this invention. More concretely, for example, lead is used for the superconducting films 11 and 12, and lead-indium alloy for the intermediate layer 13. Instead of lead, a metal such as niobium and tantalum may be used for 11 and 12. In this case, a suitable alloy, such as niobium-molybdenum alloy or niobiumtantalum alloy, is used for the layer 13.

The reason why a hard superconductor is used for the intermediate layer 13 will be described below. As known, superconductors are classified chiefly as soft superconductors and hard superconductors. The magnetization characteristics of these two types of superconductors with respect to the applied magnetic field are quite different from each other. In the soft superconductor, when the applied magnetic field is larger than the critical magnetic field $Hc$, a magnetic flux uniformly enters into the superconductor, and the superconducting state is destroyed. While, the hard superconductor has a lower critical magnetic field $Hc_1$ and an upper critical magnetic field $Hc_2$. When the applied magnetic field is smaller than $Hc_1$, no magnetic flux enters into the superconductor. If, however, the applied magnetic field is between $Hc_1$ and $Hc_2$, the magnetic flux enters into the superconductor regularly based on the quantum magnetic flux as a unit. Now, it is considered that an oscillation output is produced in the Josephson element because the quantum flux moves in the intermediate layer coherently and in an orderly manner. From this point of view, the intermediate layer must be of the hard superconductor type.

Referring to FIG. 5, the reason why the critical magnetic fields of the films 11 and 12 must be larger than the lower critical magnetic field $Hc_1$ of the intermediate layer 13 will be described. As mentioned above, the Josephson element operates in the a.c. effect region only when the films 11 and 12 are in the superconducting state, and the intermediate layer 13 is in the mixed state (i.e., the state where the quantum flux enters into the intermediate layer). To realize such a state, it is necessary that the magnetic field covering the element be larger than the lower critical magnetic field $Hc_1$ of the superconductor which constitutes the intermediate layer 13 and, at the same time, such magnetic field is smaller than the critical magnetic field $Hc$ of the films 11 and 12. When the superconducting material used for the film 11 is different from that used for the film 12, the smaller one of their critical magnetic fields is considered as $Hc$, or when the same superconductor is used for both the films 11 and 12, the smaller one of their lower critical magnetic fields is considered as $Hc$. In either case, the relationship, $Hc_1 < Hc$, must be established.

Satisfying the requirement $Hc_1 < Hc$, the largest possible $Hc_1$ is obtained by the arrangement that, for example, niobium or lead is used for the films 11 and 12, and lead-indium alloy, niobium-molybdenum alloy, niobium-tantalum alloy, or the like is used for the intermediate layer 13. In this case, the value of $Hc_1$ is several hundred oersteds. While, in the conventional element, the equivalent $Hc_1$ of the thin insulating layer is about 1 oersted. The a.c. output P of the element of this invention calculated by Equation (4) is about $10^6$ times larger than that of the conventional element.

An example of the method of manufacturing the element of this invention, as illustrated in FIG. 5, will be described below. First, lead is evaporated to the surface of a glass or quartz substrate to a width of 0.1 mm and thickness of 1 to 2 $\mu$ by vacuum evaporation. This is easily done by the technique of mask evaporation of photoresist. Then, mask exchange is effected and indium is evaporated on the lead film to a thickness of several hundred angstroms. Further, lead is evaporated thereto to a thickness of more than 1 to 2 $\mu$ by the use of a rectangular mask, part of which crosses the indium layer of rectangular shape. During this evaporation process, lead is diffused into the indium evaporation film from the lead evaporation film in a short period of time whereby the indium layer turns into a lead-indium alloy layer. Thus, a superconducting element in which a lead-indium alloy thin film layer of hard superconductor is located between thin lead films of soft superconductor is obtained. As another example, niobium, molybdenum and niobium (in this order) are evaporated to the surface of a glass substrate and diffused thereinto in a vacuum oven whereby an element having a niobium-molybdenum alloy intermediate layer is obtained. Also, to form the intermediate layer, niobium-molybdenum alloy or the like may be directly evaporated thereto.

Figure 6:
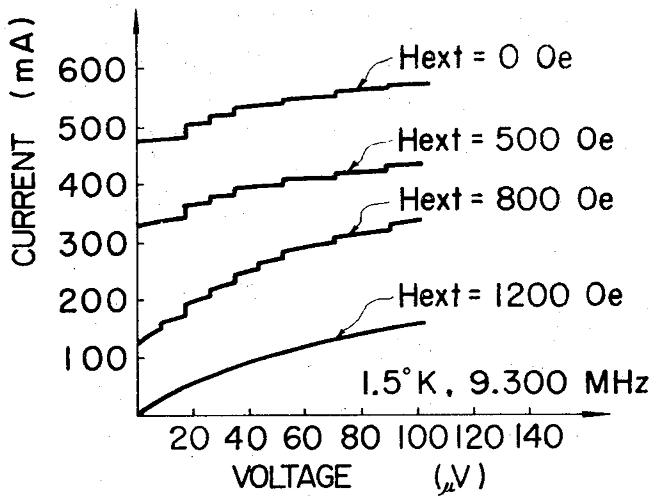
FIG. 6 is a diagram showing current-voltage characteristics of a superconducting element of this invention.

FIG. 6 is a characteristic diagram showing the result of experiment on the element in which an indium-lead alloy layer is formed between two lead superconducting layers. In this experiment, a 9300 MHz microwave was irradiated on the element, and the voltage applied to the element itself and the current flowing in the element was measured to find the relationship between the voltage and current. The external magnetic fields Hext applied to the element were 0, 500, 800 and 1200 oersteds as shown in FIG. 6.

As apparent from this characteristic diagram, $Ic$ of the element of this invention is as large as several hundred milliamperes in contrast to several milliamperes of current $Ic$ of the conventional Josephson element. This proves the foregoing theoretical prediction. When a microwave is applied to the element, the current flowing therein changes in steps at a voltage satisfying Equation 1 and also at a voltage several times larger than the voltage satisfying Equation 1. The length of this step is closely related to the value of the microwave output power delivered from the element. In the experiment, the length of the step was observed to be larger by short of one order than that in the conventional Josephson element. This shows that the element of this invention is capable of delivering a far gerater oscillation output than the conventional element.

Another distinctive feature of the element of this invention in comparison with the conventional element is that a microwave oscillation is produced even if a large external magnetic field is applied to the element. For example, as shown in FIG. 6 the current step change is clearly observable even when Hext is 800 oersteds. This shows that the oscillation can be continued under a large external magnetic field. In other words, the oscillation stability against the external magnetic field is great. This advantage is significant especially when evaluating the oscillation element.

Figure 7:
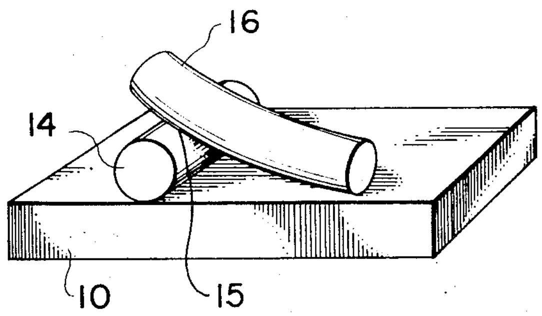
FIG. 7 is a perspective view of another embodiment of this invention.

FIG. 7 is a schematic illustration of another embodiment of this invention. This element is formed in such a manner that tantalum, molybdenum, tantalum-molybdenum alloy, niobium-tantalum alloy and the like are evaporated onto the surface of a thin superconductor wire 14 of niobium or the like which is secured to a substrate 10 of glass or the like, a thin superconductor wire 16 of niobium or the like is pressed to the above evaporated metal, a current is made to flow directly from the thin wire 14 to 16 in super-vacuum or pure argon atmosphere, the temperature at the junction of the two thin wires is raised to join the two wires by melting whereby a superconducting alloy layer 15 is formed between the thin wires 14 and 16.

It was experimentally observed that this element shows nearly the same current-voltage characteristics as shown in FIG. 6.

As has been described above, the superconducting element of this invention is formed essentially in such a manner that a hard superconductor layer with a thickness of about several tens to several thousands angstroms is formed between two mutually similar or different type of superconductors, the lower critical magnetic field of which hard superconductor layer is smaller than the critical magnetic field of the two superconductors. This element is capable of delivering a far greater d.c. current and a.c. oscillation output than the conventional element. Because the frequency of the oscillation output is proportional to the voltage applied to the element itself, the element of this invention can be used for microwave modulation. Also, the element of this invention, when operated on its negative resistance characteristic, can be effectively used as a switching element or memory element or the like.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. A superconducting element comprising: first and second superconducting layers; and a third layer of hard superconducting material interposed between said first and second layers in electrical contact therewith;

said third layer having a low and a higher critical magnetic field with said low critical magnetic field being smaller than the critical magnetic fields of said first and second layers.

2. A superconducting element according to claim 1, wherein said third superconducting layer has a thickness of several tens to several thousands of angstroms.

3. A superconducting element according to claim 1, wherein said first and second layers are composed of a soft superconducting material.

4. A superconducting element according to claim 3, wherein said first and second layers are made of different soft superconducting materials.

5. A superconducting element according to claim 3, wherein said first and second layers are provided in the form of superconducting wires and said third layer is formed on one of said wires, the two wires being in contact with each other on a partial area of their surfaces at the point of contact with said third layer.

6. A superconducting element according to claim 1, wherein said third layer is formed of a material selected from the group consisting of a lead-indium alloy, a niobium-molybdenum alloy, and a niobium-tantalum alloy.

7. A superconducting element according to claim 1, wherein said first layer is made of lead.

8. A superconducting element according to claim 1, wherein said first layer is made of niobium.

* * * * *